US009319062B2

(12) United States Patent
Danneels

(10) Patent No.: US 9,319,062 B2
(45) Date of Patent: Apr. 19, 2016

(54) DYNAMIC RANGE REDUCTION FOR ANALOG-TO-DIGITAL CONVERTERS

(71) Applicant: Nokia Corporation, Espoo (FI)

(72) Inventor: Hans Danneels, El Cerrito, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/474,627

(22) Filed: Sep. 2, 2014

(65) Prior Publication Data

US 2016/0065237 A1    Mar. 3, 2016

(51) Int. Cl.
*H03M 3/00*         (2006.01)

(52) U.S. Cl.
CPC ..................................... *H03M 3/322* (2013.01)

(58) Field of Classification Search
CPC ....... H03M 3/322; H03M 3/454; H03M 3/30; H03M 3/368; H03M 3/424; H03M 3/458
USPC ............ 341/143, 155; 455/333; 375/350, 319
See application file for complete search history.

(56) References Cited

U.S. PATENT DOCUMENTS

| 6,577,258 | B2 * | 6/2003 | Ruha | H03M 3/392 |
| | | | | 341/143 |
| 6,606,359 | B1 * | 8/2003 | Nag | H03F 1/304 |
| | | | | 375/319 |
| 6,839,387 | B1 * | 1/2005 | Mittel | H03M 7/3008 |
| | | | | 341/143 |
| 7,129,875 | B1 * | 10/2006 | Altun | H03M 3/322 |
| | | | | 341/120 |
| 7,554,474 | B2 | 6/2009 | Le Guillou | 341/143 |
| 7,928,878 | B1 * | 4/2011 | Coban | H03M 3/344 |
| | | | | 341/143 |
| 8,351,490 | B2 * | 1/2013 | Chen | H03F 1/223 |
| | | | | 340/10.1 |
| 2003/0083035 | A1 | 5/2003 | Staszewski et al. | |
| 2006/0199562 | A1 * | 9/2006 | Taylor | H03F 3/45179 |
| | | | | 455/333 |
| 2011/0051670 | A1 * | 3/2011 | Safarian | H04B 1/525 |
| | | | | 370/328 |
| 2011/0075775 | A1 * | 3/2011 | Coban | H03M 3/344 |
| | | | | 375/350 |
| 2013/0194114 | A1 * | 8/2013 | Ritter | H03M 3/368 |
| | | | | 341/110 |

OTHER PUBLICATIONS

"Quantization (signal processing)", http://en.wikipedia.org/wiki/Quantization_(signal_processing); 1/212/2014, 15 pgs.
"A 14-b 12-MS/s CMOS Pipeline ADC With Over 100-dB SFDR", Yun Chiu, et al., IEEE 2004, pp. 2139-2151.
"Delta-Sigma Data Conversion in Wireless Transceivers", Ian Galton, IEEE, 2002, pp. 302-315.
"RF-to-Baseband Digitization in 40 nm CMOS With RF Bandpass ΔΣ Modulator and Polyphase Decimation Filter", Ewout Marten et al., IEEE 2012, pp. 990-1002.
"A 71dB-SNDR 50MS/s 4.2mW CMOS SAR ADC by SNR Enhancement Techniques Utilizing Noise", ISSCC 2013/Session 15/Data Converter Tecvhniques/15.3, IEEE 2013, 3 pgs.
"A Continuous-Time ΣΔ ADC With Increased Immunity to Interferers", Kathleen Philips, et al., IEEE 2004, pp. 2170-2178.

(Continued)

*Primary Examiner* — Jean B Jeanglaude
(74) *Attorney, Agent, or Firm* — Harrington & Smith

(57) ABSTRACT

In accordance with the exemplary embodiments of the invention there is at least an apparatus to perform a method including receiving by an analog-to-digital converter a signal; determining whether an in-band blocker is present in the signal; and adjusting a transfer function of the analog-to-digital converter based on whether an in-band blocker is present by configuring a loop filter of the analog-to-digital converter.

17 Claims, 4 Drawing Sheets

(56) References Cited

OTHER PUBLICATIONS

"A 1.7 mW 1 lb 250 MS/s 2-Times Interleaved Fully Dynamic Pipelined SAR ADC in 40 nm Digital CMOS," Bob Verbruggen et al., IEEE 2012, pp. 2880-2887.

"A 3mW Continuous-Time ΣΔ-Modulator for EDGE/GSM with High Adjacent Channel Tolerance", Markus Schimper, IEEE 2004, pp. 183-186.

"A Wideband 400 MHZ-to-4 GHz Direct RF-to-Digital Multimode ΔΣ Receiver", Charles Wu et al., IEEE 2014, pp. 1639-1652.

"Understanding delta-sigma data converters", Richard Schreier, et al., vol. 74, Chapter 1, pp. 1-8, IEEE 2005.

H. Kim et al.; "Adaptive Blocker Rejection Continuous-Time ΣΔ ADC for Mobile WiMAX Applications"; IEEE Journal of Solid-State Circuits, vol. 44, No. 10; Oct. 2009; pp. 2766-2779.

J. Marttila et al.; "Multistage Quadrature Sigma-Delta Modulators for Reconfigurable Multi-Band Analog-Digital Interface in Cognitive Radio Devices"; EURASIP Journal on Wireless Communications and Networking 2011; Jan. 2011; whole document (20 pages).

* cited by examiner

DYNAMIC RANGE REDUCTION FOR ANALOG-TO-DIGITAL CONVERTERS

TECHNICAL FIELD

The teachings in accordance with the exemplary embodiments of this invention relate generally to optimize use of a transfer function of a signal of an analog-to-digital converter, such as a delta sigma analog-to-digital converter, in a device and, more specifically, relate to adjusting and optimizing signal transfer functions of an analog-to-digital converter for different requirements based on the presence of in-band blockers in the signal.

BACKGROUND

Power efficiency can be critical in mobile communication systems. The energy consumption for devices such as mobile devices can be limited by battery and/or energy capacity. As such efforts are continually being made to increase efficiency of power utilized by these devices. However, in today's configurations a great deal of this power or energy may be needlessly used or wasted in these mobile devices.

The analog-to-digital conversion (ADC) process is an important function in LTE transceivers as it contributes considerably to the power consumption and hence power cost of a receiver. Particularly, the specifications of the analog-to-digital converter (ADC) yields to a power cost for the receiver. This is even more critical for LTE receivers which support carrier aggregation (CA) as they typically consist of multiple receiver paths and hence multiple ADCs which require even more power.

This paper provides exemplary embodiments for improving at least AN ADC specification creating more efficient power consumption in devices such as mobile devices.

Certain abbreviations that may be found in the description and/or in the Figures are herewith defined as follows:
3GPP LTE—Third generation partnership project long term evolution
ABB—Analog Base Band
ADC—analog to digital converter
BW—bandwidth
CA—carrier aggregation
CT ADC—continuous time ADC
DBB—Digital Base Band
DR—dynamic range
DS-ADC—Delta Sigma analog to digital converter
DT ADC—discrete time ADC
ENOB—effective number of bits
LUT—LookUp Table
NTF—noise transfer function
OSR—oversampling ratio
SAR—successive approximation register
STF—signal transfer function
UE—user equipment.

SUMMARY

In an exemplary aspect of the invention there is a method comprising, receiving by an analog-to-digital converter a signal; determining whether an in-band blocker is present in the signal; and adjusting a transfer function of the analog-to-digital converter based on whether an in-band blocker is present by configuring a loop filter of the analog-to-digital converter.

In an exemplary aspect of the invention there is an apparatus comprising: at least one processor; and at least one memory including computer program code, where the at least one memory and the computer program code are configured, with the at least one processor, to cause the apparatus to at least: receive by an analog-to-digital converter a signal; determine whether an in-band blocker is present in the signal; and adjust a transfer function of the analog-to-digital converter based on whether an in-band blocker is present by configuring a loop filter of the analog-to-digital converter.

In an exemplary aspect of the invention there is an apparatus comprising: means for receiving by an analog-to-digital converter a signal; means for determining whether an in-band blocker is present in the signal; and means for adjusting a transfer function of the analog-to-digital converter based on whether an in-band blocker is present by configuring a loop filter of the analog-to-digital converter.

In an exemplary aspect of the invention as described in the paragraph above, the means for receiving comprises an interface to a communication network, and wherein the means for determining and adjusting comprises at least one memory including computer program code, the computer program code executed by at least one processor.

BRIEF DESCRIPTION OF THE DRAWINGS

The foregoing and other aspects of embodiments of this invention are made more evident in the following Detailed Description, when read in conjunction with the attached Drawing Figures, wherein.

DETAILED DESCRIPTION

Figure 1:
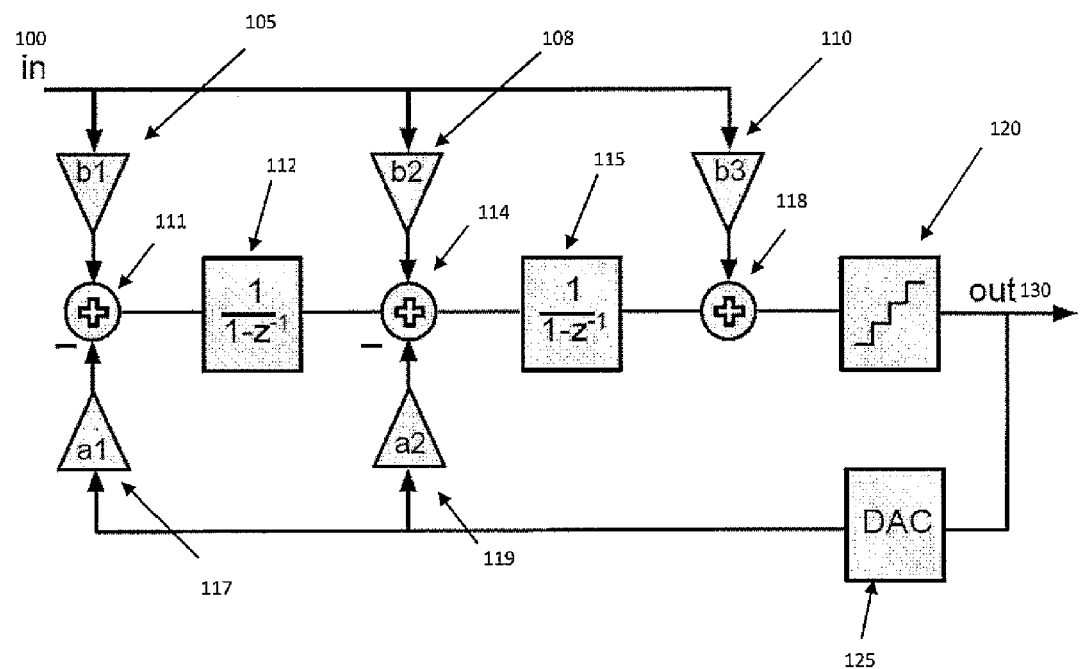
FIG. 1 shows schematic overview of a (e.g., $2^{nd}$ order) DS ADC implementation in accordance with the exemplary embodiments of the invention.

In accordance with the embodiments of this invention, there is focus on reducing the specifications of the analog-to-digital converter (ADC) yields to power and cost saving for the receiver. The exemplary embodiments are even more beneficial for LTE receivers supporting carrier aggregation (CA) which typically consist of multiple receiver paths and hence multiple ADCs.

A current state of technology designs an ADC according to increased dynamic range (DR) requirements caused by the in-band blockers. An ADC's dynamic range is the range of signal amplitudes which the ADC can resolve. More particularly, dynamic range of the ADC relates to the range of the input signal levels that can be measured simultaneously. The dynamic range relates in particular the ability to measure small signals accurately in the presence of the large signals. The range of frequencies an ADC can measure is based at least on its bandwidth (BW) and how accurately it can measure a signal relative to any introduced noise. An ADC dynamic range includes a number of output levels of a signal it can digitally process such that the levels match the input analog signal.

Some ADC technology designs which are considered in this paper include the following:

Pipelined ADCs: The pipelined analog-to-digital converter (ADC) is a popular ADC for sampling rates from a few mega samples per second (Msps) up to 100 Msps+ per second. These ADCs can obtain good performance at high sampling frequencies. This comes at the cost, however, of high power consumption (and area) due to the high count of building blocks (amplifiers, comparators, etc.).

Successive-approximation-register (SAR) ADCs: a SAR ADC is another common architecture of choice for sampling in medium to high resolution requirement applications generally with sample rates under 5 Msps. The SAR ADC has a good power consumption rate, but is not seen to offer adequate DR for the required BWs and sampling rates due to matching.

Pipelined SAR ADC: This combines SAR and pipelined principles to boost the performance. ENOB of around 9 for the required BWs, however, are still not sufficient.

Delta-Sigma (DS) ADCs: These ADCs use oversampling to reduce the complexity of the blocks for a certain DR. They are used, for example, in direct RE-to-digital receivers. Due to their extremely large over sampling ration (OSR), a DS-ADC can theoretically achieve a high DR. This can come at the cost however of high power usage clock generation and buffer circuits as phase noise at frequencies served by the DS-ADC can substantially burden the performance of a system.

Still, in spite of these issues DS-ADCs are becoming more and more popular, especially when used with moderate OSRs (when it is not used as a direct RF-to-digital receiver). The STF is usually designed to be flat in the BW of the oversampled ADC, i.e. the frequency span from DC to fs/2. More complex and higher order filter implementations (which are needed for low OSRs) experience STF peaking at frequencies around fs/2. This can create instability and distortion when blockers are present at these frequencies. Therefore, techniques may be are used to reduce the STF-peaking and not reduce the blocker levels of in-band blockers which are below fs/2.

As indicated previously an ADC configuration is designed according to increased dynamic range (DR) requirements caused by the in-band blockers. This can result in further issues with current radio technologies such as LTE. In LTE and LTE advanced for example the appearance of blockers in the ADC puts a high constraint on the dynamic range and the sampling frequency of the ADC. The out-of-band blockers can be filtered out by anti-alias filters prior to the ADC but the in-band cannot be filtered enough to avoid aliasing and hence need to be considered as in-band signals and filtered in the digital domain. Since higher sampling frequencies then the Nyquist BW-frequency need to be used (to avoid aliasing of these in-band blockers), the DS-ADC is an interesting choice as an ADC for these applications. By applying the proposed STF technique, the in-band blockers can be filtered and hence the DR requirement of the ADC can be relaxed up to 3 bits for low OSRs (10-16).

The exemplary embodiments of the invention can be used to optimize the STF and the NTF of the DS-ADC by either apply filtering and reduce the effect of in-band blockers (and hence reduce the requirements of the overall DS-ADC) or maximizing the quantization noise shaping and hence the NTF-effect. This STF and NTF can either be fixed for a certain application or it can be made programmable to adapt towards varying circumstances of the incoming signal.

The exemplary embodiments of this ADC provide a beneficial system that is usable for both continuous time and discrete time (DT) implementations of a DS-ADC, although it can be easier to implement in a DT DS-ADC.

Embodiments of the present invention provide for an ADC design that addresses particular challenges that have been introduced by current and developing wireless communication designs. Third generation partnership project long term evolution (3GPP LTE) and 3GPP LTE-advanced (LTE-A) signals are characterized by large blockers, both in-band and out-of band, that put significant constraints on LTE receivers. These large blockers may also be referred to as dominant blockers in this paper. The blockers that are imposed may be up to 80 dB greater than the desired signal. The signal needs to be carefully filtered prior to the ADC in order to reduce the blockers below the noise floor and avoid aliasing effects. For blockers that are near in frequency to the desired signal, sufficient filtering is difficult to achieve, requiring power-hungry, high-order filters. Such signals are viewed as in-band signals for the ADC, imposing a number of difficulties relating to setting the sampling frequency and dynamic range (DR) requirements of the ADC:

Nyquist samplers cannot be used and thus higher sampling frequencies need to be used. This leads to a higher power consumption in clock buffers, active elements, and similar components The DR of the ADC is much higher than the DR of the desired signal. This yields to a need for extra bits in the ADC and hence a higher power consumption.

In accordance with an exemplary embodiment of the invention there is an adjustment of these blockers to optimize the ADC requirements and hence benefit its power consumption. A reduction of 6 dB for example could result in 1 bit less of sampling data and a first order power savings of roughly 50%.

In accordance with the exemplary embodiments there is at least:

Optimizing the STF of the ADC to filter out in-band blockers instead of optimizing NTF (to maximize noise shaping); and/or Making use of programmability of the system to adjust the STF (and NTF) in different modes and for different requirements:

When large or dominant in-band blockers are present=>apply filtering STF to reduce blocker and DR.

When no in-band blockers are present or there are not dominant in-band blockers present=>flatten or low filtering STF to increase noise-shaping effect.

The exemplary embodiments of the invention provide benefit over current technologies for at least the reasons that in other DS-ADC implementations the STF only has poles starting from fs/2. Whereas, in accordance with the exemplary embodiments filtering may starts at frequencies of fs/10-fs/20 depending on an oversampling ratio (OSR). Further, in other DS-ADC implementations a manipulation of the STF may be performed only to compensate for the increase/bubble of the STF at frequencies around fs/2, and mainly in a feedforward architecture. Thus, in other implementations in-band blockers, which are close to the own band of interest, will not benefit especially in cases where higher OSRs are used. Further, in cases where higher blocker tolerance is implemented with a direct feed-forward path (DFFP) to reduce the intermediate voltages at the output of the integrators, STF behavior filtering in accordance with the exemplary embodiments can be implemented with a direct feed path (DFFP) and hence reducing the intermediate voltages at the output of the integrators. This technique is compatible with different solutions since the STF behavior filtering can be implemented using different topologies, and/or with different orders.

In addition, the exemplary embodiments of the invention can make use of the signal transfer function (STF) of a Delta- Sigma ADC (DS-ADC) to partially filter out in-band blockers and hence reduce the dynamic range (DR) restrictions of the ADC. The filter of the ADC hence acts as the loop filter for the ADC enabling noise shaping which pushes the quantization noise out-of-band. Furthermore, the filter of the ADC acts as a filter to reduce the power of the blockers close to the wanted band.

Now exemplary embodiments of the invention are described with regards to FIG. 1. FIG. 1 shows the schematic overview of a (e.g., $2^{nd}$ order) DS ADC implementation.

As shown in FIG. 1, there is an overview showing an example of an implementation of a DT DS-ADC in accordance with the exemplary embodiments. The feed forward programmable filter coefficients are given by b1 105, b2 108, and b3 110. In this system, the implementation consists of two integrators 112 and 115 (as being a second order system) as a non-limiting example. These integrators can also have a programmable gain coefficient, but this is not indicated in this example. The ADC device path includes programmable feedback coefficients a1 117 and a2 119. The ADC device path connected to a quantizer 120 and an output out 130. In addition, as shown in FIG. 1 there is a feedback path including a DAC 125 which transforms the digital output signal to an analog signal and is connected with summation circuits 111 and 114 (according the programmable feedback gain coefficients 117 and 119).

The signal and the quantization noise each have a different transfer characteristic, described by the STF and NTF for the design example given in FIG. 1 with the algorithms as follows:

$$STF = \frac{b_1 + b_2(1-z^{-1}) + b_3(1-z^{-1})^2}{1 + a_1 z^{-1} + a_2 z^{-1}(1-z^{-1})}$$

$$NTF = \frac{(1-z^{-1})^2}{1 + a_1 z^{-1} + a_2 z^{-1}(1-z^{-1})}$$

It can be seen that the denominator of the STF and NTF are equal meaning that poles in the STF yield to poles in the NTF as well. For this reason, the STF is commonly designed to be flat up to fs/2 in DS ADCs and the coefficients a1, a2, b1, b2 and b3 are derived to have optimal noise shaping. If not, the effect of the noise shaping is reduced since the high-pass behavior of the NTF becomes 'flattened' by the pole.

Figure 2:
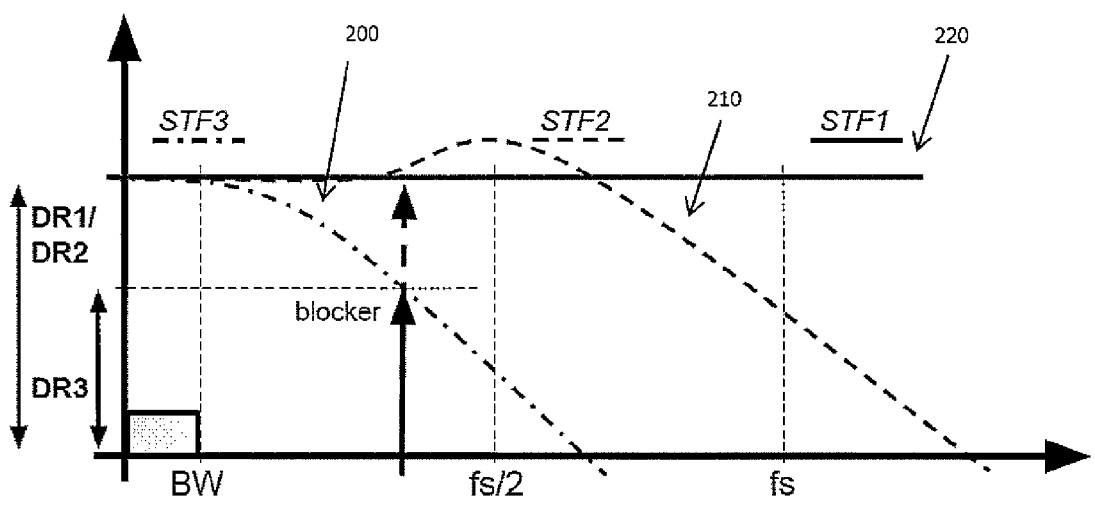
FIG. 2 shows dynamic ranges differences between 3 STF implementations in accordance with the exemplary embodiments of this invention.

When a large in-band blocker is present, however, it is important that the DR of the ADC is sufficient to quantize this blocker and filter it in the digital domain. The filtering effect inside the signal band can be used to partially filter out this in-band blocker. This is shown in FIG. 2 where the difference between 3 STF implementations is given. STF1 (220) describes the (usual) desired flat STF which would result in maximum noise shaping. STF2 (210) gives a practical STF which is flat until half of the sampling frequency (fs/2). Due to the implementation, STF peaking can occur, i.e. a higher gain for frequencies around fs/2. This is negative when blockers occur at these frequencies. Optimal noise filtering is still obtained. Finally, STF3 (200) describes the STF with a pole close to the BW of the desired signal. Therefore, the blocker is partially filtered out and the DR (DR3) is less than the required DR for situations 1 and 2 (DR1 and DR2). This comes at the cost of reduced noise shaping for this configuration.

LTE has a very specific frequency spectrum. In some situations, high close to band blockers are present while in other cases, they are not. This can be detected by the digital backend. The ADC can therefore be configured in two ways:

no dominant in-band blockers=>The coefficients are configured for a flat STF and optimal noise shaping for better SNR.

Dominant in-band blockers=>The coefficients are configured for a filtering STF to reduce DR of the ADC For practical implementations, this comes down to adjusting the parameters of the loop filter. In accordance with the exemplary embodiments, for discrete time ADCs (DT-ADC), this can be done by adjusting the capacitor values or farad levels in the loop filter while for continuous time ADCs (CT-ADC), this can be done by adjusting the resistor values or resistance in the loop filter. In accordance with the exemplary embodiments the capacitor and resistor values and/or coefficients can be adjusted with a programming interface to a processor associated with an ADC performing the exemplary embodiments and/or by related components as described below in FIG. 3.

Figure 3:
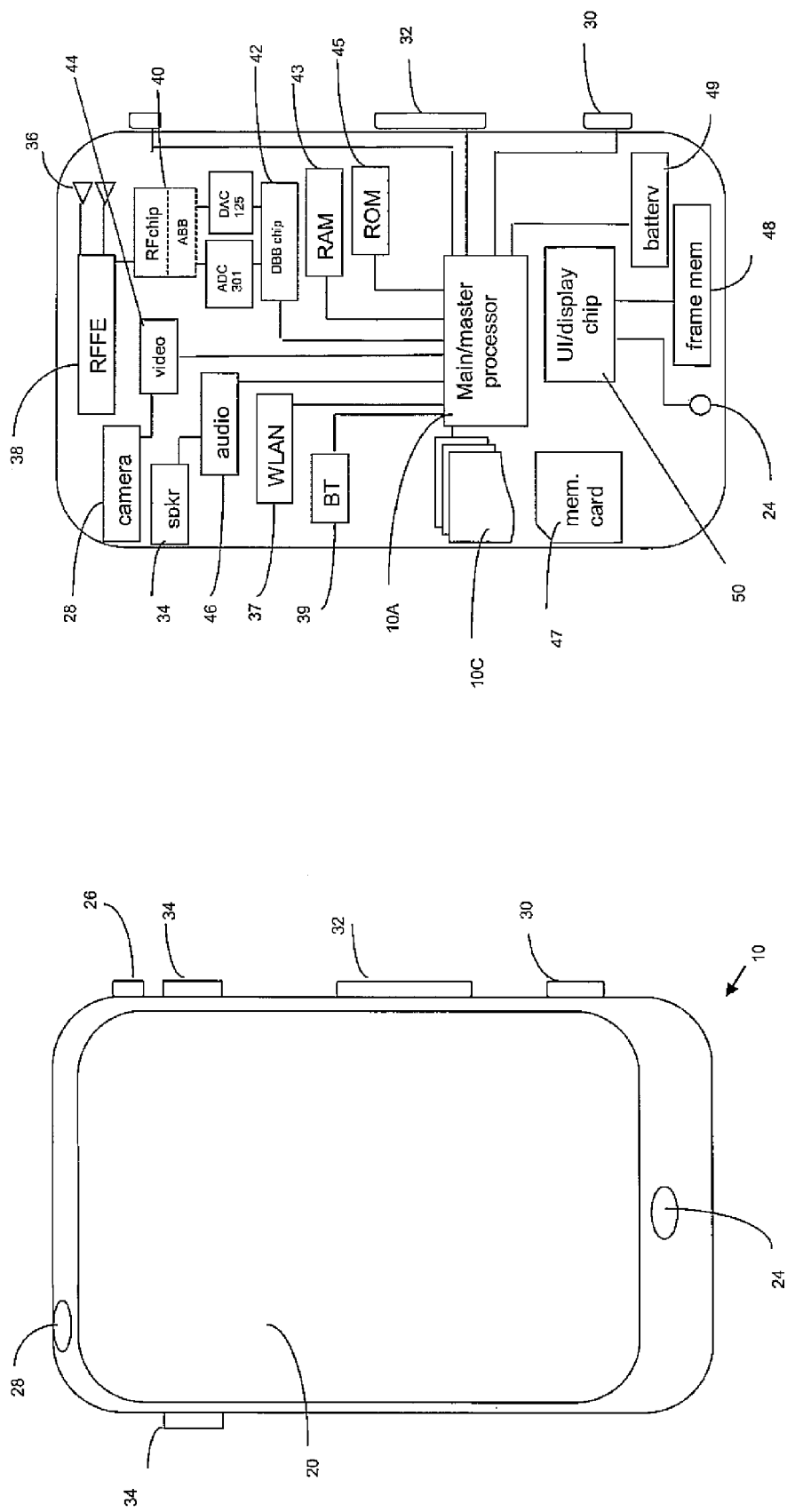
FIG. 3 shows a schematic diagram in plain view (left) and sectional view (right) of a mobile handset capable of performing operations according to an exemplary embodiment of the invention.

FIG. 3 illustrates further detail of an exemplary UE 10 in both plan view (left) and sectional view (right) which may be configured to perform the operations in accordance with the exemplary embodiments. As shown in FIG. 3, the UE 10 includes a graphical display interface (e.g., touchscreen) 20 and a user interface that comprises a microphone 24 and speaker(s) 34 and touch-screen technology at the graphical display interface 20 and/or voice-recognition technology for audio signals received at the microphone 24. A power actuator 26 controls the UE 10 being turned on and/or off by the user. The UE 10 may include a camera(s) module 28, which is shown as forward facing (e.g., for video calls) but may alternatively or additionally be rearward facing (e.g., for capturing images and video for local storage). The camera(s) 28 may be controlled by a shutter actuator 30 and optionally by a zoom actuator 32, which may alternatively function as a volume adjustment for the speaker(s) 34 when the camera 28 is not in an active mode. Signals to and from the camera(s) 28 pass through an image/video processor (video) 44, which encodes and decodes the image data (e.g., image frames). A separate audio processor 46 may also be present to control signals to and from the speakers (spkr) 34 and the microphone 24. The graphical display interface 20 is refreshed from a frame memory (frame mem) 48 as controlled by a user GPU 50, which may process signals to and from the display interface 20. These actuators may also be implemented using touch-screen technology.

Also within the sectional view of FIG. 3 are seen multiple transmit/receive antennas 36 that are typically used for wireless communication (e.g., cellular communication). The antennas 36 may be multi-band for use with other radios in the UE. The operable ground plane for the antennas 36 may span the entire space enclosed by the UE housing, though in some embodiments the ground plane may be limited to a smaller area, such as disposed on a printed wiring board on which a RF front-end (RFFE) 38 is formed. The RFFE 38 controls power amplification on the channels being transmitted on and/or across the antennas that transmit simultaneously, where spatial diversity is used. The RFFE 38 outputs to the radio frequency (RF) chip 40, which amplifies, demodulates and down converts the signal for analog baseband (ABB) processing. The analog to digital converter (ADC) 301 converted analog signal to bit-stream, which the digital baseband (DBB) chip 42 detects and finally decoded. Similar processing occurs in reverse for signals generated in the UE 10 and transmitted from the UE.

The DBB and/or RFIC may also include any of a processor and a memory including computer program code, which controlling transceivers parameters to optimize performance of it. Program code could be storage to memory and it may include algorithms and/or lookup tables (LUT). In addition, it is noted that the placement of any of these components are not limiting and any of the components shown in FIG. 3 may be placed differently and still operate in accordance with the exemplary embodiments. As an example, the ADC and DAC could be on the RFIC side or in the BB side or they even could be separate from both. It is noted that the configuration shown in FIG. 3 is not limiting to operations performed in accordance with the exemplary embodiments of the invention.

Certain exemplary embodiments of the UE 10 may also include one or more secondary radios such as a wireless local area network radio (WLAN) 37 and/or a Bluetooth radio (BT) 39, which may incorporate one or more on-chip antennas or be coupled to one or more off-chip antennas. Throughout the UE 10 are various memories 125, such as a random access memory (RAM) 43, a read only memory (ROM) 45, and, in some exemplary embodiments, a removable memory such as the illustrated memory card 47. In some exemplary embodiments, various programs (such as computer program code 315) are stored on the memory card 47. The components within the UE 10 may be powered by a portable power supply such as a battery 49.

It is noted that the communications and/or operations as described in FIG. 3 are non-limiting to the exemplary embodiments of the invention. The devices and the related operations are merely illustrative of devices for use in practicing the exemplary embodiments of this invention. Any of these operations can be performed using any suitable device including a mobile user equipment as shown in FIG. 3. Further, the operations as described below may be performed in a different order and/or by different devices than what is described. The exemplary embodiments of the invention may be used in any device which includes an ADC. Such device can include, but are not limited to, smartphones, tablets, PDAs. Further, the exemplary embodiments of the invention may be practiced in any device with an LTE interface.

Figure 4:
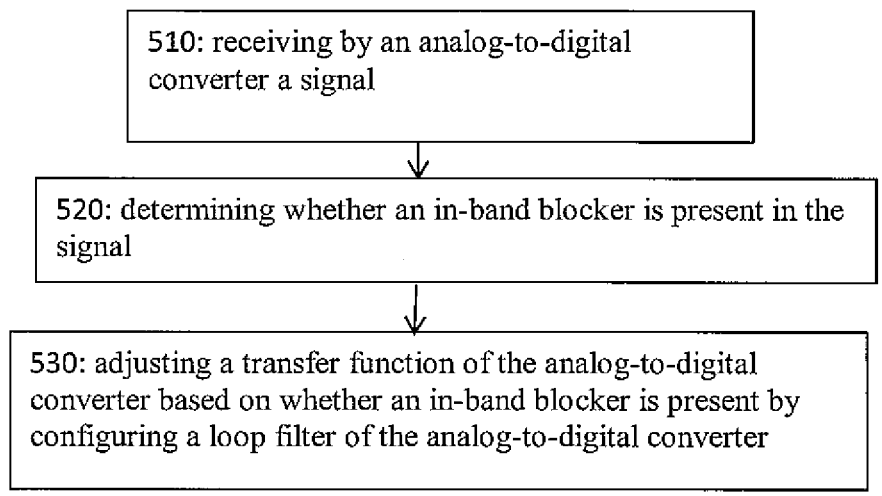
FIG. 4 shows a method in accordance with the exemplary embodiments which may be performed by an apparatus.

FIG. 4 illustrates operations in accordance with the exemplary embodiments which may be performed by an ADC.

FIG. 4 shows a method in accordance with the exemplary embodiments which may be performed by an apparatus. FIG. 4 illustrates operation of a method in accordance with the exemplary embodiments of the invention. As shown in step 510 there is receiving by an analog-to-digital converter a signal. As shown in step 520 there is determining whether an in-band blocker is present in the signal. Then as shown in step 530 there is adjusting a transfer function of the analog-to-digital converter based on whether an in-band blocker is present by configuring a loop filter of the analog-to-digital converter.

In accordance with the exemplary embodiments as described in the paragraph above for a case that an in-band blocker is not present in the signal the loop filter is configured to adjust a noise transfer function of the analog-to-digital converter to optimize a noise-shaping effect of the signal.

In accordance with the exemplary embodiments as described in the paragraph above for a case that an in-band blocker is present the loop filter is configured to adjust a signal transfer function of the analog-to-digital converter to partially filter the in-band blocker.

In accordance with the exemplary embodiments as described in the paragraph above the in-band blocker is a dominant in-band blocker.

In accordance with the exemplary embodiments as described in the paragraph above there is in response to partially filtering the in-band blocker a dynamic response requirement of the analog-to-digital converter is reduced by 1 or more bits.

In accordance with the exemplary embodiments as described in the paragraph above if the analog-to-digital converter is a discrete time converter the configuring the loop filter comprises adjusting capacitor parameters of the loop filter.

In accordance with the exemplary embodiments as described in the paragraph above wherein if the analog-to-digital converter is a continuous time delta sigma analog to digital converter the configuring the loop filter comprises adjusting resistor parameters of the loop filter.

In accordance with the exemplary embodiments as described in the paragraph above the analog-to-digital converter is a delta-sigma analog-to-digital converter In accordance with an exemplary embodiment of the invention as described above there is an apparatus comprising: means for receiving, by a device, a signal; means for receiving by an analog-to-digital converter a signal; a means for determining whether an in-band blocker is present in the signal, and a means for adjusting a transfer function of the analog-to-digital converter based on whether an in-band blocker is present by configuring a loop filter of the analog-to-digital converter [b1 105, b2 108, b3 110, a1 117 and a2 115 and integrators 112 and 115].

The apparatus may be, include or be associated with at least one software application, module, unit or entity configured as arithmetic operation, or as a computer program or portions thereof (including an added or updated software routine), executed by at least one operation processor, unit or module. Computer programs, also called program products or simply programs, including software routines, applets and/or macros, may be stored in any apparatus-readable data storage medium. A computer program product may comprise one or more computer-executable components which, when the program is run, are configured to carry out embodiments described above by means of FIG. 4. Additionally, software routines may be downloaded into the apparatus.

The apparatus, such as a node or user device, or a corresponding component, may be configured as a computer or a microprocessor, such as single-chip computer element, or as a chipset, including or being coupled to a memory for providing storage capacity used for software or arithmetic operation(s) and at least one operation processor for executing the software or arithmetic operation(s).

In general, the various embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
   receiving by an analog-to-digital converter a signal;
   determining whether an in-band blocker is present in the signal; and
   adjusting a transfer function of the analog-to-digital converter based on whether an in-band blocker is present by configuring a loop filter of the analog-to-digital converter.

2. The method of claim 1, wherein for a case that an in-band blocker is not present in the signal the loop filter is configured to adjust a noise transfer function of the analog-to-digital converter to optimize a noise-shaping effect of the signal.

3. The method of claim 1, wherein for a case that an in-band blocker is present the loop filter is configured to adjust a signal transfer function of the analog-to-digital converter to partially filter the in-band blocker.

4. The method of claim 1, wherein the in-band blocker is a dominant in-band blocker.

5. The method of claim 3, wherein in response to partially filtering the in-band blocker a dynamic response requirement of the analog-to-digital converter is reduced by 1 or more bits.

6. The method of claim 1, wherein if the analog-to-digital converter is a discrete time converter the configuring the loop filter comprises adjusting capacitor parameters of the loop filter.

7. The method of claim 1, wherein if the analog-to-digital converter is a continuous time delta sigma analog to digital converter the configuring the loop filter comprises adjusting resistor parameters of the loop filter.

8. The method of claim 1, wherein the analog-to-digital converter is a delta-sigma analog-to-digital converter.

9. A non-transitory computer readable medium embodying computer program instructions, the computer program instructions executed by at least one processor to cause an apparatus to perform the method according to claim 1.

10. An apparatus comprising:
    at least one processor; and
    at least one memory including computer program code, where the at least one memory and the computer program code are configured, with the at least one processor, to cause the apparatus to at least:
    receive by an analog-to-digital converter a signal;
    determine whether an in-band blocker is present in the signal; and
    adjust a transfer function of the analog-to-digital converter based on whether an in-band blocker is present by configuring a loop filter of the analog-to-digital converter.

11. The apparatus of claim 10, wherein for a case that an in-band blocker is not present in the signal the loop filter is configured to adjust a noise transfer function of the analog-to-digital converter to optimize a noise-shaping effect of the signal.

12. The apparatus of claim 10, wherein for a case that an in-band blocker is present the loop filter is configured to adjust a signal transfer function of the analog-to-digital converter to partially filter the in-band blocker.

13. The apparatus of claim 10, wherein the in-band blocker is a dominant in-band blocker.

14. The apparatus of claim 12, wherein in response to partially filtering the in-band blocker a dynamic response requirement of the analog-to-digital converter is reduced by 1 or more bits.

15. The apparatus of claim 10, wherein if the analog-to-digital converter is a discrete time converter the configuring the loop filter comprises adjusting capacitor parameters of the loop filter.

16. The apparatus of claim 10, wherein if the analog-to-digital converter is a continuous time delta sigma analog to digital converter the configuring the loop filter comprises adjusting resistor parameters of the loop filter.

17. The apparatus of claim 10, wherein the analog-to-digital converter is a delta-sigma analog-to-digital converter.

* * * * *